INTEGRATED CIRCUIT ANALOG-TO-DIGITAL CONVERTER

Filed Oct. 20, 1967

INVENTOR
MICHAEL B. FRENCH
BY Laurence J. Marhoefer
ATTORNEY 3,541,546

INTEGRATED CIRCUIT ANALOG-TO-DIGITAL CONVERTER

Michael B. French, Blue Point, N.Y., assignor to Potter Instrument Company, Inc., Plainview, N.Y., a corporation of New York Filed Oct. 20, 1967, Ser. No. 676,975
Int. Cl. H03k *13/02*
U.S. Cl. 340—347 1 Claim

ABSTRACT OF THE DISCLOSURE

This analog-to-digital converter is a clock J–K flip-flop whose inputs are fed respectively in phase and in anti-phase with an analog signal.

BACKGROUND OF THE INVENTION

This invention relates to a voltage level comparing circuit and, more particularly, to an improved analog-to-digital converter.

One object of the invention is to provide an analog-to-digital converter whose output waveform is independent of the input signal frequency over a wide range extending from a direct current (D.C.) signal at the lower end of the range.

Another object of the invention is to provide an analog-to-digital converter which provides an output signal that can be interpreted unambiguously in the presence of input noise signals of the same order of magnitude as the information signals.

And a further object of this invention is the provision of an analog-to-digital converter utilizing commercially available integrated circuits.

SUMMARY OF THE INVENTION

Briefly, this invention contemplates making a clocked J–K flip-flop into an analog-to-digital converter by feeding the analog signal in phase and in anti-phase to the two input terminals of the flip-flop.

As used in this application, and as commonly understood by those skilled in the art, a J–K flip-flop is a bistable multivibrator having two input terminals designated for convenience as J and K. At the termination of a clock pulse, a certain trigger voltage level on the J input, for example, will set the flip-flop to its logical 1 or on state; this same voltage level on the K input will reset the flip-flop to its logical 0 or off state; and the trigger voltage level simultaneously on both inputs will cause it to change state regardless of what state it had been in.

A more detailed logical description of such flip-flops may be found in the book entitled "Logic Design of Digital Computers" by Montgomery Phister, Jr., published in 1958 by John Wiley & Sons, Inc., New York, N.Y. A typical J–K flip-flop circuit is shown and described in a publication entitled "Texas Instrument Series 54/74 Integrated Circuits," published in 1966 by Texas Instrument, Inc., Dallas 22, Tex.

BRIEF DESCRIPTION OF THE DRAWINGS

Having briefly described this invention, it will be described in greater detail along with other objects and advantages in the following detailed description of a preferred embodiment which may be best understood by reference in the accompanying drawings. These drawings form part of the instant specification and are to be read in conjunction therewith. Like reference numerals are used to indicate like parts in the various views.

In the drawings.

BRIEF DESCRIPTION OF THE PREFERRED EMBODIMENTS

Figure 1:
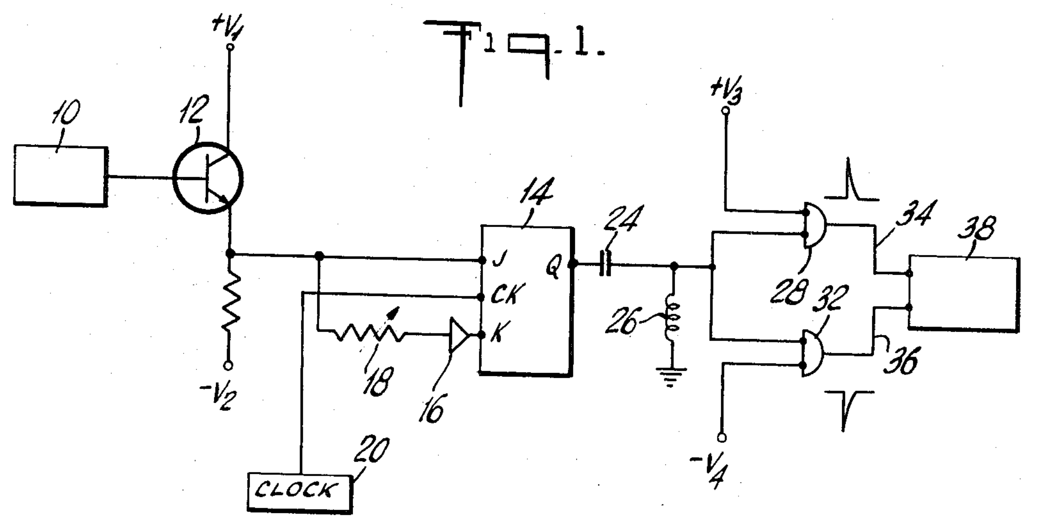
FIG. 1 is a block diagram of an embodiment of the analog-to-digital converter constructed in accordance with the teachings of this invention.

Referring now to FIG. 1 of the drawings, a transducer 10 having a substantially sine waveform output signal is coupled to the base of a NPN transistor 12 which has a load resistor 22 in series with its emitter and operates as an emitter follower amplifier. The transducer 10, for example, may comprise a pair of superimposed optical gratings for measuring distance, for example, and its output is directly coupled to the base of transistor 12.

A lead directly couples the emitter of transistor 12 to terminal J of an integrated circuit J–K flip-flop 14, such as the J–K flip-flop designated 5N7473 which is available from Texas Instruments, Inc. of Dallas, Tex.; a D.C. inverting amplifier 16 and a variable resistor 18 directly couple the emitter also to a terminal K of this same flip-flop. A clock pulse generator 20 is coupled to a clock input terminal CK.

NPN transistor 12 establishes a slightly negative bias D.C. level $-V_2$ for the inputs to flip-flop 14 and protects the flip-flop from large negative signals that would reverse bias the substrate of the integrated circuit, and thus lead to the destruction of the device.

A capacitor 24 and an inductor 26 form a differentiating network which differentiates the output pulse train from terminal Q of flip-flop 14. The positive and negative spikes thusly generated are coupled to one input terminal of AND gates 28 and 32; the enabling inputs to these gates are coupled to suitable sources of bias potential $+V_3$ and $-V_4$, respectively, so that gate 28 passes positive spikes to its output lead 34 and gate 32 passes negative spikes to its output lead 36.

Leads 34 and 36 are coupled to the inputs of a bidirectional binary counter 38. The counter 38 counts up, for example, for each pulse received on line 34 and counts down for each pulse received on line 36. The pulse repetition rate of the clock pulse generator 20 is high relative to the maximum possible frequency of the output signal from transducer 10, but is lower than the maximum pulse repetition rate that can be counted by the counter 38. Thus, a noise signal, irrespective of its amplitude and frequency, does not produce any resultant change in the output of counter 38 since the net change in signal level produced by noise is zero and the state of flip-flop 14 cannot change at a higher rate than the counter can count.

Figure 2:
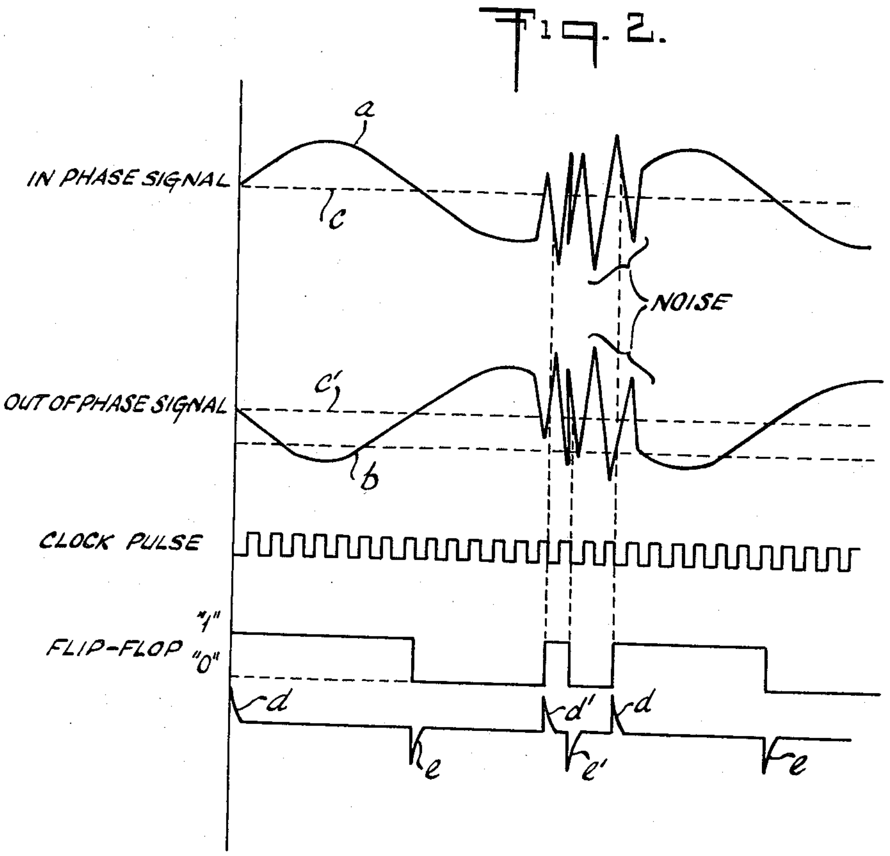
FIG. 2 is a diagram of the waveforms at various points of FIG. 1 indicated by corresponding letters on FIGS. 1 and 2.

Referring now to FIG. 2 in addition to FIG. 1, in operation, a sinusoidal signal *a* in phase with the output of transducer 10 is coupled to the J terminal of flip-flop 14, and a similar signal *b* which is 180° out of phase with signal *a* is coupled to the K terminal. These signals may vary between the limits of $+V_1$ and $-V_2$; signal *a* is symmetrical about a D.C. voltage level *c* and signal *b* is symmetrical about a level *c'*, which is slightly less than level *c* due to the voltage drop across resistor 18. This off-set between level *c* and *c'* provides a slight hysteresis for the system, making the system stable in operation. The amount of hysteresis, and the degree of stability, can be adjusted by varying the value of variable resistor 18.

The flip-flop 14 is so biased that when the signal level at terminals J or K exceeds the level *c*, the flip-flop changes state on the trailing edge of the next clock pulse. As shown in FIG. 2, the in phase signal *a* switches the flip-flop to its so-called logical 1 output voltage state, and the out-of-phase signal *b* switches the flip-flop to its so-called logical zero voltage state.

The differentiating network of capacitor 24 and inductor 26 differentiates the leading and trailing edge of the output waveform from flip-flop 14 to produce positive and negative spikes *d* and *e*, respectively.

A noise signal, such as shown in FIG. 2, causes the flip-flop 14 to change state. However, owing to the fact that the flip-flop can only change state at the trailing edge of a clock pulse, the pulse repetition rate of the positive and negative spikes which are a result of this noise can not exceed the maximum counting rate of the counter 38. Since the average value of any noise signal is zero, the net change in the number of counts stored by counter 38 is also zero. Thus, when the noise subsides, the state of the flip-flop correctly indicates the state of the information signal.

Thus, it will be appreciated that the objects of the invention have been accomplished. Owing to the switching characteristics of the J–K flip-flop, the rise and fall times of output waveform is independent of the frequency of the input signal. In addition, noise signals of the same order of magnitude as the information signal produce no net change in the output flip-flop and its output unambiguously represents the state of the input signal. In addition, the J–K flip-flop is a readily available commercial integrated circuit.

It will be understood that certain features and subcombinations are of utility and may be employed without reference to other features and subcombinations. This is contemplated by and is within the scope of the claim. It is further obvious that various changes may be made in details within the scope of the claim without departing from the spirit of the invention. It is, therefore, to be understood that this invention is not to be limited to the specific details shown and described.

What is claimed is:

1. An analog-to-digital converter comprising, in combination:

a generally sinusoidally varying source of signals, a J–K flip-flop having two signal input terminals, and one output terminal, first means coupling said sinusoidally varying signal source to one input terminal of said flip-flop, second means including an inverting circuit coupling said generally sinusoidally varying signal source to the other input terminal of said flip-flop, whereby the two signal input terminals of said J–K flip-flop are fed respectively in phase and in anti-phase from said generally sinusoidally varying signal source, a binary up-down counter having two input terminals, the count of said counter being advanced upon receipt of a signal at one of its input terminals and diminished upon receipt of an input signal at the other of its input terminals, and means including a differentiating circuit for coupling said output terminal of said J–K flip-flop to the input terminals of said counter whereby the differentiated output of said flip-flop of one polarity causes an increase in said count and the differentiated output of said flip-flop of opposite polarity causes a decrease during the count of said counter.

References Cited

UNITED STATES PATENTS

| | | | |
|---|---|---|---|
| 2,965,891 | 12/1960 | Martin | 340—347 |
| 3,195,056 | 7/1965 | Trautwein | 307—272 X |

MAYNARD R. WILBUR, Primary Examiner

C. D. MILLER, Assistant Examiner